United States Patent
Van Stralen et al.

(10) Patent No.: US 6,516,437 B1
(45) Date of Patent: Feb. 4, 2003

(54) TURBO DECODER CONTROL FOR USE WITH A PROGRAMMABLE INTERLEAVER, VARIABLE BLOCK LENGTH, AND MULTIPLE CODE RATES

(75) Inventors: Nick Andrew Van Stralen, Schenectady, NY (US); Stephen Michael Hladik, Albany, NY (US); Abdallah Mahmoud Itani, Ballston Spa, NY (US); Robert Gideon Wodnicki, Schenectady, NY (US); John Anderson Fergus Ross, Del Mar, CA (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/519,903

(22) Filed: Mar. 7, 2000

(51) Int. Cl.⁷ ..................... H03M 13/27; H03M 13/29; H03M 13/45

(52) U.S. Cl. ....................... 714/755; 714/786
(58) Field of Search .................. 714/755, 786

(56) References Cited

U.S. PATENT DOCUMENTS

| | | | |
|---|---|---|---|
| RE32,905 E | 4/1989 | Baran | 310/104 |
| 5,349,589 A | 9/1994 | Chennakeshu et al. | 371/43 |
| 5,406,570 A | 4/1995 | Berrou et al. | 371/43 |
| 5,446,747 A | 8/1995 | Berrou | 371/45 |
| 5,721,745 A | 2/1998 | Hladik et al. | 371/43 |
| 5,721,746 A | 2/1998 | Hladik et al. | 371/43 |
| 5,734,962 A | 3/1998 | Hladik et al. | 455/12.1 |
| 6,381,728 B1 * | 4/2002 | Kang | 375/265 |
| 6,434,203 B1 * | 8/2002 | Halter | 375/262 |

FOREIGN PATENT DOCUMENTS

| | | |
|---|---|---|
| EP | 0 735 696 | 10/1996 |
| FR | 2 675 970 | 10/1992 |

OTHER PUBLICATIONS

"Turbo Code Decoder with Controlled Probability Estimate Feedback," JAF Ross; SM Hladik; NA VanStralen, JB Anderson, Ser. No. 09/137,257 (GE docket RD–25781), filed Aug. 20, 1998.

"Turbo Code Decoder with Modified Systematic Symbol Transition Probabilities," SM Hladik; JAF Ross; NA Van-Stralen; Ser. NO. 09/137,256 (GE docket RD–26016), filed Aug. 20, 1998.

"A Maximum a Posteriori Estimator with a Fast Sigma Calculator," JAF Ross; AM Itani; NA VanStralen; SM Hladik; Ser. No. 09/137,260 (GE docket RD–26035), filed Aug. 20, 1998.

"High–Data Rate Maximum a Posteriori Decoder for Segmented Trellis Code Words," SM Hladik; NA VanStralen; JAF Ross; Ser. No. 09/137,181 (GE docket RD–26064), filed Aug. 20, 1998.

"Source and Channel Coding, an Algorithmic Approach," John B. Anderson; Seshadri Mohan, pp. 216, 336–342.

(List continued on next page.)

Primary Examiner—Stephen M. Baker
(74) Attorney, Agent, or Firm—John Thompson; Patrick K. Patnode

(57) ABSTRACT

A turbo decoder control comprises an address generator for addressing systematic data, parity data, and systematic likelihood ratios according to a pre-determined memory mapping. The systematic data samples are accessed in the order required by the MAP decoding algorithm such that interleaving and de-interleaving functions in the MAP decoding algorithm are performed in real-time, i.e., without delay. Such memory-mapping in combination with data handling functions (e.g., multiplexing and combinatorial logic) minimizes memory requirements for the turbo decoder and allows for use of programmable interleavers, variable block lengths, and multiple code rates.

14 Claims, 7 Drawing Sheets

OTHER PUBLICATIONS

"Decision Depths of Convolutional Codes," John B. Anderson; Kumar Balachandran; IEEE Transactions on Information Theory, vol. 35, No. 2, Mar. 1989, pp. 455–459.

"The Turbo Coding Scheme," Jakob Dahl Anderson, Report IT–146 ISSN 0105–854, Jun. 1994, Revised Dec. 1994, pp. 1–48.

"An Efficient Adaptive Circular Viterbi Algorithm for Decoding Generalized Tailbiting Convolutional Codes," Richard V. Cox, Car–Erik W. Sundberg; IEEE Transactions on Vehicular Technology, vol. 43, No. 1, Feb. 1994, pp. 57–68.

"On Tail Biting Convolutional Codes," Howard H. Ma; Jack K. Wolf, IEEE Transactions on Communications, vol. Com–34, No. 2, Feb., 1990, pp. 104–111.

"An Efficient Maximum Likelihood Decoding Algorithm for Generalized Tailbiting Convolutional Codes Including Quasicyclic Codes," Qiang Wang and Vijay K. Bhargava, IEEE Transactions on Communications, vol. 37, No. 8, Aug. 1989, pp. 875–879.

"Illuminating the Structure of Code and Decoder of Parallel Concatenated Recursive Systematic (Turbo) Codes," Patrick Robertson, IEEE, 1994, pp. 1298–1303.

"Near Shannon Limit Error–Correcting Coding and Decoding: Turbo–Codes (1)," Claude Berrou, Alain Glavieux, Punya Thitimajshima, IEEE, 1993, pp. 1064–1070.

"Optimal Decoding of Linear Codes for Minimizing Symbol Error Rate," LR Bahl; J Cocke; F. Jelinek; J. Raviv; IEEE Transactions on Information Theory, Mar. 1974, pp. 284–287.

"Near Optimum Error Correcting Coding and Decoding: Turbo–Codes," Claude Berrou; IEEE Transactions on Communications, vol. 44, No. 10, Oct. 1996, pp. 1261–1271.

"A Comparison of Optimal and Sub–Optimal Map Decoding Algorithms Operating in the Log Domain," Patrick Robertson; Emmanuelle Villebrun; Peter Hoeher; IEEE 1995, pp. 1009–1013.

"Terminating the Trellis of Turbo–Codes in the Same State," AS Barbulescu; SS Pietrobon, Electronics Letters Jan. 5, 1995 vol. 31, No. 1, pp. 22–23.

"Terminating the Trellis of Tubo–Codes," O. Joerssen; H. Meyr; Electronics Letters Aug. 4, 1994 vol. 30, No. 16, pp. 1285–1286.

"A Viterbi Algorithm with Soft–Decision Outputs and its Applications," Joachim Hagenauer; Peter Hoeher; IEEE 1989, pp. 1680–1686.

* cited by examiner

US 6,516,437 B1

TURBO DECODER CONTROL FOR USE WITH A PROGRAMMABLE INTERLEAVER, VARIABLE BLOCK LENGTH, AND MULTIPLE CODE RATES

BACKGROUND OF THE INVENTION

The present invention relates generally to error-correction coding and, more particularly, to a decoder for parallel convolutional codes, i.e., turbo codes.

A new class of forward error control codes, referred to as turbo codes, offers significant coding gain for power limited communication channels. Turbo codes are generated using two recursive systematic encoders operating on different orderings of the same information bits. A subset of the code bits of each encoder is transmitted in order to maintain bandwidth efficiency. Turbo decoding involves an iterative algorithm in which probability estimates of the information bits that are derived for one of the codes are fed back to a probability estimator for the other code. Each iteration of processing generally increases the reliability of the probability estimates. This process continues, alternately decoding the two code words until the probability estimates can be used to make reliable decisions.

The maximum a posteriori (MAP) type algorithm introduced by Bahl, Cocke, Jelinek, and Raviv in "Optimal Decoding of Linear Codes for Minimizing Symbol Error Rate", *IEEE Transactions on Information Theory*, March 1974, pp. 284–287, is particularly useful as a component decoder in decoding parallel concatenated convolutional codes, i.e., turbo codes. The MAP algorithm is used in the turbo decoder to generate a posteriori probability estimates of the systematic bits in the code word. These probability estimates are used as a priori symbol probabilities for the second MAP decoder. Three fundamental terms in the MAP algorithm are the forward and backward state probability functions (the alpha and beta functions, respectively) and the a posteriori transition probabilities (the sigma function).

It is desirable to provide a control and data handling structure for a turbo decoder which allows for a programmable interleaver, variable block length, and multiple code rates.

BRIEF SUMMARY OF THE INVENTION

A control for a turbo decoder utilizing a MAP decoding algorithm comprises an address generator for addressing systematic data symbols, parity data symbols, and systematic likelihood ratios according to a pre-determined memory mapping. A control signal indicates which of a plurality of component code words comprising a turbo code word is being decoded, each employing the same memory mapping. The systematic data symbol values are accessed in the order required by the alpha, beta and gamma functions of the MAP decoding algorithm such that interleaving and de-interleaving functions in the MAP decoding algorithm are performed in real-time, i.e., without delay. The systematic symbol and parity symbol contributions to the gamma function of the MAP decoding algorithm are computed in parallel using parallel channel transition probability look-up tables, such that the channel transition probabilities required in the gamma calculations are accessed at the same rate as the likelihood ratios. This memory-mapping in combination with other data handling functions (e.g., multiplexing, combinatorial logic and parallel processing) minimizes memory requirements for the turbo decoder and enables the use of programmable interleavers, variable block lengths, and multiple code rates.

DETAILED DESCRIPTION OF THE INVENTION

Turbo Decoder Structure

Figure 1:
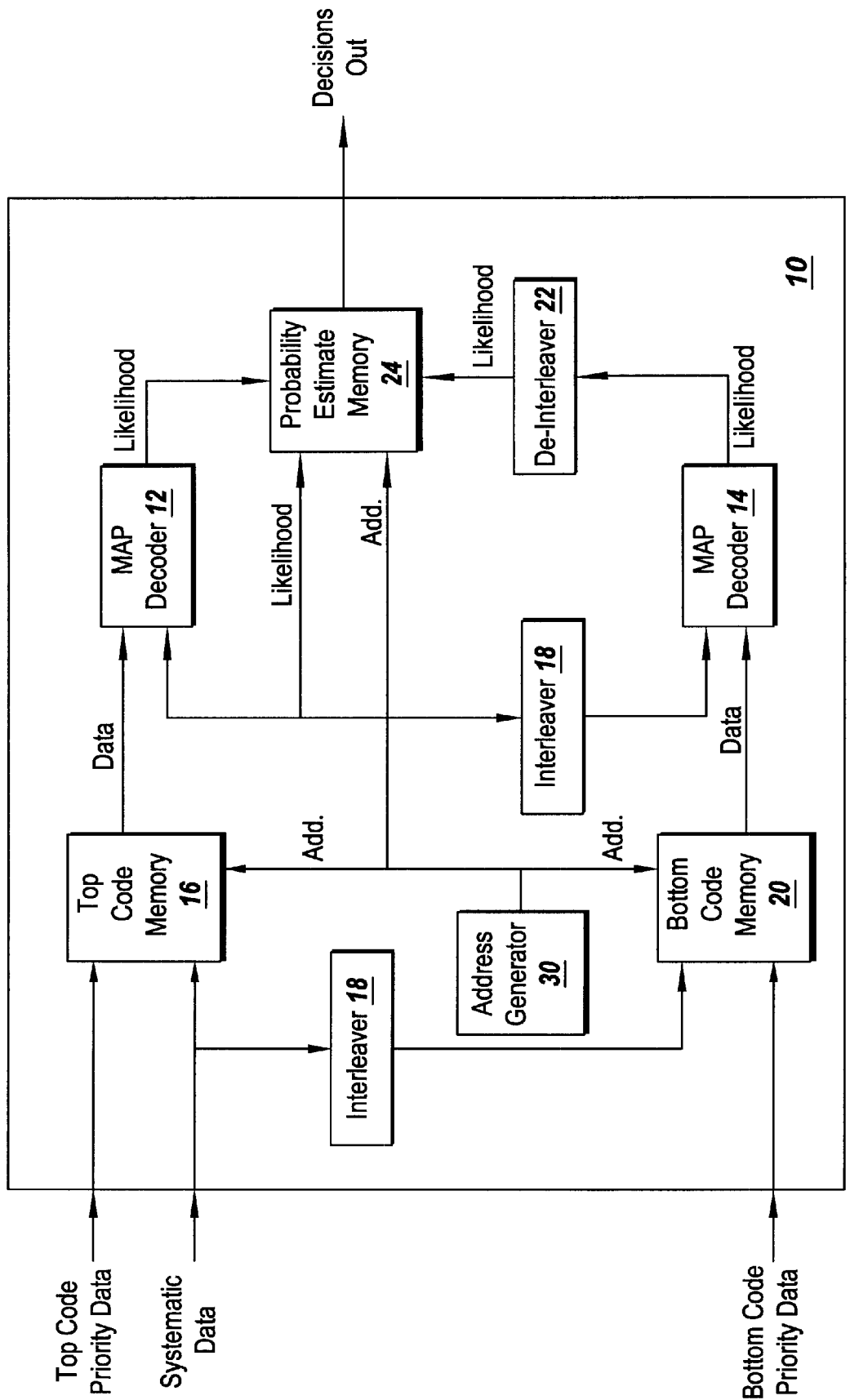
FIG. 1 is a block diagram illustrating a turbo decoder utilizing a MAP decoding algorithm.

A MAP decoder provides estimates of the a posteriori probabilities of the states and transitions of a Markov source through a discrete memory-less channel. The transition probabilities of a discrete memory-less channel depend on the transitions $X_1^\tau$ of the Markov source and the observations $Y_1^\tau$ such that for a sequence, $$\Pr\{Y_1^t \mid X_1^t\} = \prod_{j=1}^{t} R(Y_j \mid X_j) \qquad 1$$

where $R(\cdot|\cdot)$ defines the channel probabilities.

The MAP decoder uses the received sequence $Y_1^\tau$ to estimate the a posteriori state and transition probabilities of the Markov source.

$$\Pr\{S_t = m \mid Y_1^\tau\} = \Pr\{S_t = m; Y_1^\tau\}/\Pr\{Y_1^\tau\} = \lambda_t(m)/\Pr\{Y_1^\tau\} \qquad 2$$

and $$\Pr\{S_{t-1} = m'; S_t = m \mid Y_1^\tau\} = \Pr\{S_{t-1} = m'; S_t = m; Y_1^\tau\}/\Pr\{Y_1^\tau\} \qquad 3$$
$$= \sigma_t(m', m)/\Pr\{Y_1^\tau\}$$

where $S_t$ is the state of the source at time t.

The alpha, beta and gamma functions are set forth as follows:

$$\alpha_t(m) = Pr\{S_t = m; Y_1^t\} \qquad 4$$

$$\beta_t(m) = Pr\{Y_{t+1}^\tau \mid S_t = m\} \qquad 5$$

and $$\gamma_t(m', m) = Pr\{S_t = m; Y_t \mid S_{t-1} = m'\} \qquad 6$$

so that $$\lambda_t(m) = \alpha_t(m) \cdot \beta_t(m) \qquad 7$$

and $$\sigma_t(m', m) = \alpha_{t-1}(m') \cdot \gamma_t(m', m) \cdot \beta_t(m) \qquad 8$$

The alpha function is computed from the following recursion:

$$a_t(m) = \sum_{m'} \alpha_{t-1}(m') \cdot \gamma_t(m', m). \qquad 9$$

The beta function is calculated using the following recursion:

$$\beta_t(m) = \sum_{m'} \beta_{t+1}(m') \cdot \gamma_{t+1}(m, m'). \qquad 10$$

Finally, the gamma function is defined as follows:

$$\gamma_t(m', m) = \sum_X p_t(m \mid m') \cdot q_t(X \mid m', m) \cdot R(Y_t, X), \qquad 11$$

where $p_t(m|m')$ are the transition probabilities of the Markov source, and $q_t(X|m',m)$ is the distribution of the source's output symbols conditioned on the source's state transitions.

Turbo codes are constructed as two recursive systematic codes concatenated in parallel. A MAP decoder for a turbo code generates a probability estimate of the information bits in a component code word, based on one of the two recursive systematic codes comprising the turbo code, and provides this information to a second MAP decoder which decodes the other component code word of the turbo code. The second decoder uses these probabilities as a priori information and generates new estimates of the information bits in the code word. The updated estimates are provided to the first MAP component decoder, which in turn, generates updated estimates. This feedback process continues a finite number of times, and a decision on the information bits is made based on the final probability estimates. Each operation of a component MAP decoder is referred to as a half iteration, and a typical number of iterations is eight.

The two parallel component codes in a turbo code are referred to herein as the top code and the bottom code. Normally, the data is encoded by the top code and is interleaved using either a fixed block interleaver or a random interleaver before being encoded by the bottom code.

FIG. 1 illustrates a turbo decoder 10 employing component MAP decoders 12 and 14. As shown, the top code parity data is provided along with the systematic data to a top code memory 16 and then to MAP decoder 12. The systematic data is also provided, via an interleaver 18, along with the bottom code parity data to a bottom code memory 20 and then to the second MAP decoder 14. FIG. 1 also shows the feedback loop involving MAP decoders 12 and 14, interleaver 18, de-interleaver 22, a probability estimate memory 24, and an address generator 30 for It is to be noted that two component MAP decoders 12 and 14 are shown by way of illustration. However, it is to be understood that a single MAP decoder that is time-multiplexed to decode both the top and bottom codes may likewise be employed.

The systematic bit probability estimates are computed using the a posteriori transition or $\sigma_t(m',m)$ probabilities. The sum of all a posteriori transition probabilities resulting from the same channel symbol is the a posteriori probability symbol estimate. The output of a MAP component decoder is an a posteriori probability estimate of the systematic symbols, denoted as $APP_t(0)$ and $APP_t(1)$, as set forth in the following expression:

$$APP_t(k) = \Pr\{d_t = k \mid Y_1^\tau\} = \sum \sigma_t(m', m) \qquad 12$$

where the summation is over all $\sigma_t(m',m)$ values where the systematic bit corresponding to the transition (m',m) is k.

The calculated a posteriori systematic bit probabilities are stored in memory as likelihood ratios, that is, $APP_t(1)/APP_t(0)$.

Although the description herein is given with respect to non-logarithmic functions, it is to be understood that a logarithmic implementation is preferred for many applications. To this end, the mathematical expressions herein may converted to logarithmic expressions in known fashion.

Figure 2:
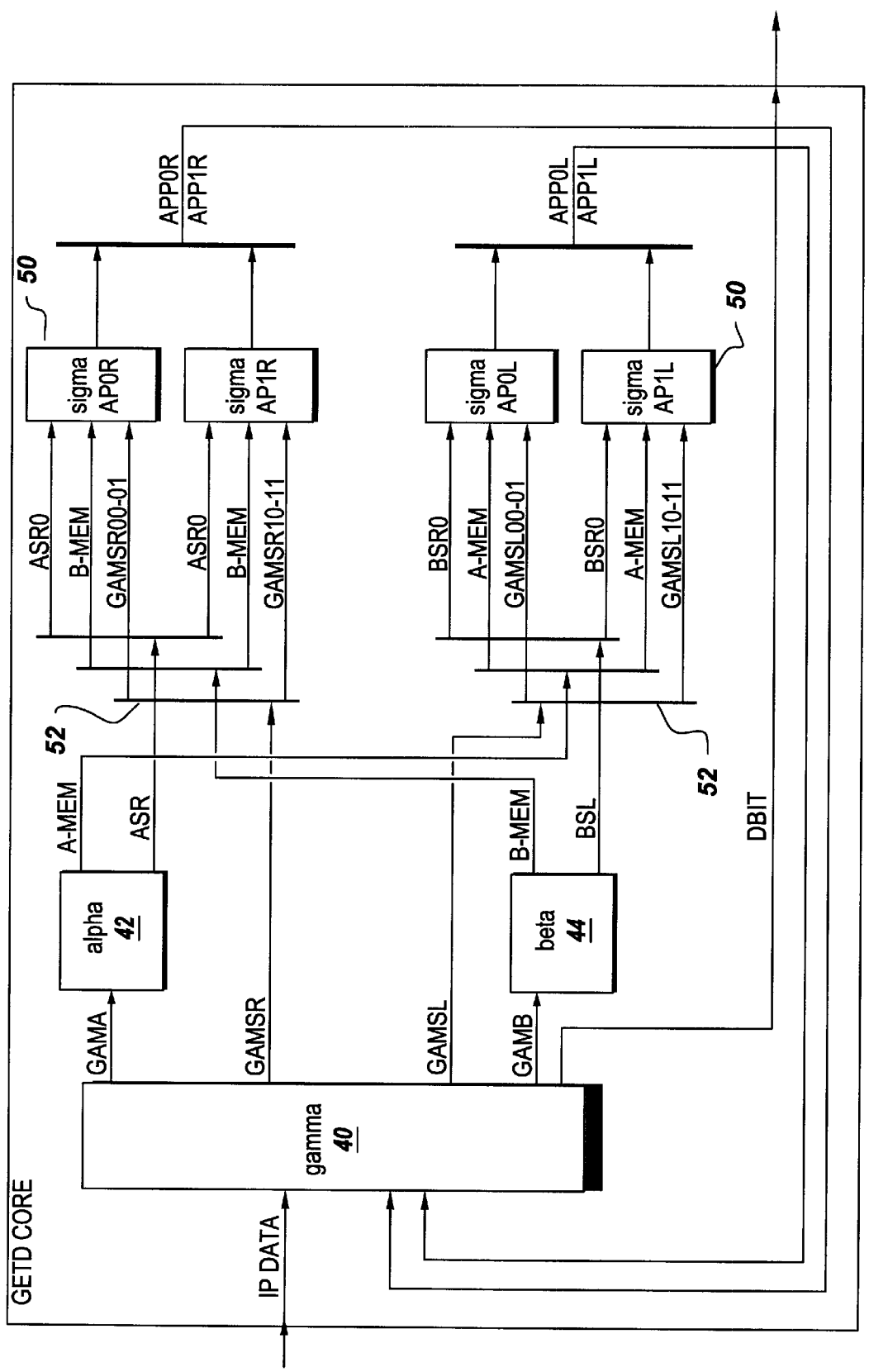
FIG. 2 is a block diagram illustrating a top level view of data flow in a MAP component decoder such as that of FIG. 1.

FIG. 2 is a top level view illustrating a preferred turbo decoder data flow structure. Each block, or functional unit, has a specific function to perform as described below. The blocks within the turbo decoder in the data path are the gamma block 40, the alpha block 42, the beta block 44, and the sigma blocks 50. Received symbols IPDATA and the a posteriori probability estimates from the sigma blocks are provided as inputs to the gamma block. Four gamma values are outputted from the gamma block, one gamma value being provided to each of the alpha and beta blocks (GAMA and GAMB, respectively); and the other gamma values (GAMSR and GAMSL) being provided via multiplexers 52 to the sigma blocks along with the present alpha and beta values (ASR, BSL) and the alpha and beta values stored in memory (A-MEM and B-MEM).

There are four sigma blocks 50 which calculate the sigma values for the transitions in the trellis. These blocks also compute an update of the a posteriori probability associated with each of the data (systematic) bits in the code word. The probability of the transmitted bit being zero (AP0R, AP0L) is computed simultaneously with the probability of the bit being one (AP1R, AP1L). Since symbol-by-symbol MAP decoding involves both forward (from the beginning to the end of the received component code word) and backward (from the end to the beginning of the received component code word) recursive calculations, as described in U.S. patent application Ser. No. 09/137,260, filed Aug. 20, 1998, the turbo decoder processes the received symbols comprising the received component code words of the received turbo code word sequentially from the first received to the last received for the forward recursion and from the last received symbol to first for the backward recursion substantially simultaneously. These operations are performed in parallel in order to minimize the delay which would otherwise result from serial sigma block calculations. For brevity, the forward recursions are referred to herein as processing received symbols comprising the component code words from the left and the backward recursions as processing symbols from the right side of the code word, and the resulting calculated values will be subscripted with L and R, respectively.

In an ASIC implementation of a turbo code, for example, it is particularly desirable to perform the interleaving and de-interleaving operations as efficiently as possible. It is also desirable that the interleaving and de-interleaving operations be performed in real time, that is, essentially without delay, in order to maximize decoding speed. The turbo decoder structure of FIG. 1 cannot perform the interleaving (or de-interleaving) operation in real time because, in general, the complete sequence is required at the input of the interleaver (or de-interleaver) before the interleaved (or de-interleaved) sequence can be generated.

Figure 3:
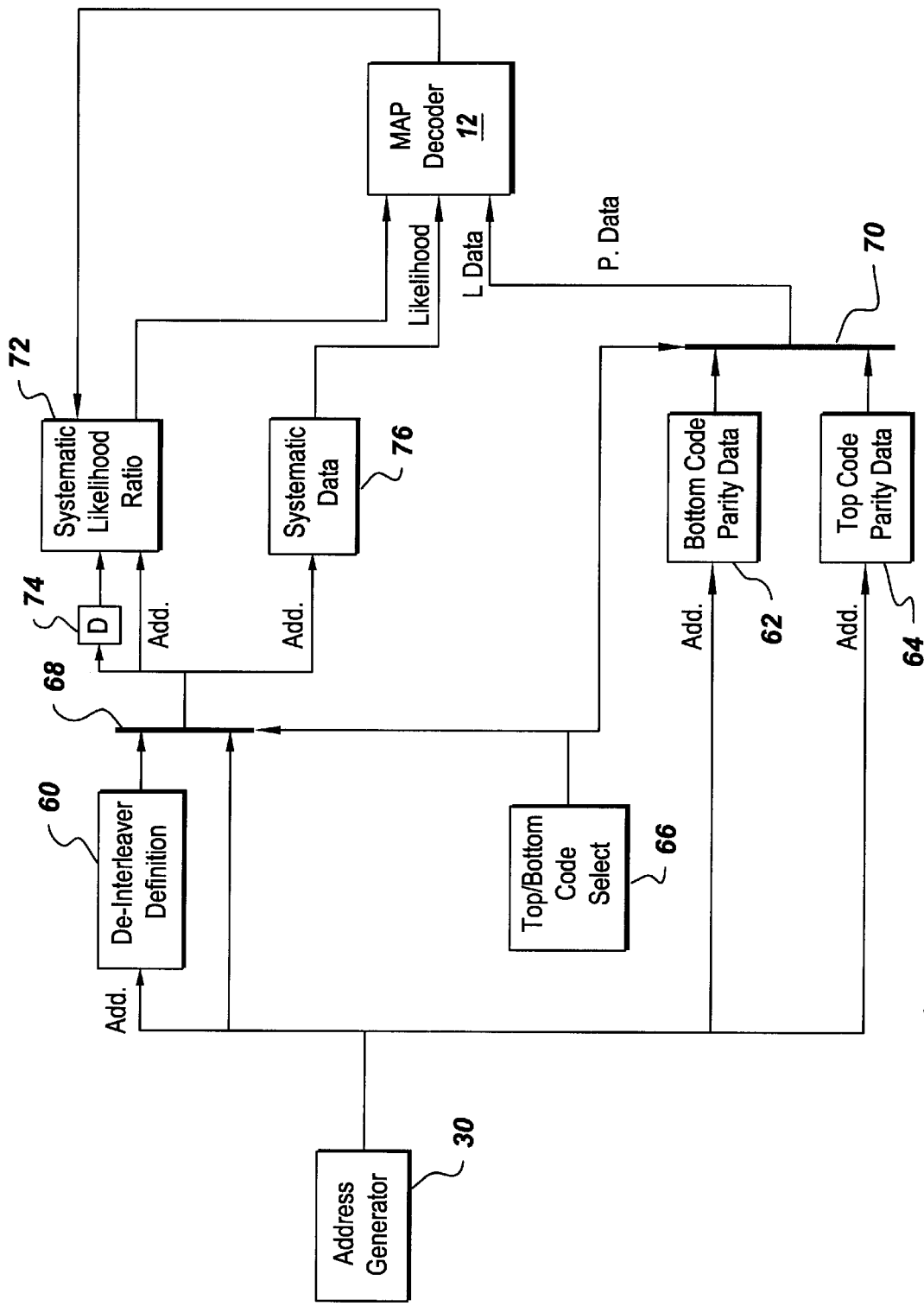
FIG. 3 is a block diagram illustrating address generation and data memory interfaces to a component decoder according to preferred embodiments of the present invention.

FIG. 3 illustrates a turbo decoder structure with control according to a preferred embodiment of the present invention which provides for real-time interleaving and de-interleaving. Address generator 30 addresses the systematic data samples in the order in which the MAP decoder requires them. In particular, instead of moving the contents of memory addresses, the addresses themselves are manipulated to provide the contents of certain locations as required.

The output of the address generator is provided to a de-interleaver definition block 60, a bottom code parity data block 62, and a top code parity data block 64. A control signal is generated by a top/bottom code select block 66 for controlling multiplexers 68 and 70. In particular, the output of the de-interleaver definition block is an address, which is used to address the received systematic symbols and a priori log-likelihood ratios. Multiplexer 68 selects, via the signal from block 66, either the address generated by the address generator or the address generated by the de-interleaver definition. The output address is applied to a systematic likelihood ratio circuit 72, both directly and through a delay block 74. The address selected by multiplexer 68 is also applied to a systematic data memory block 76. The data and likelihood ratio are applied to component MAP decoder 12. A feedback loop for the iterative MAP decoding process is shown through the likelihood ratio block. As to the parity data, the address generated by the address generator is provided to bottom code parity data block 62 and top code parity data block 64. The output of one or the other is selected via multiplexer 70 and provided as an input to MAP decoder 12.

Figure 4:
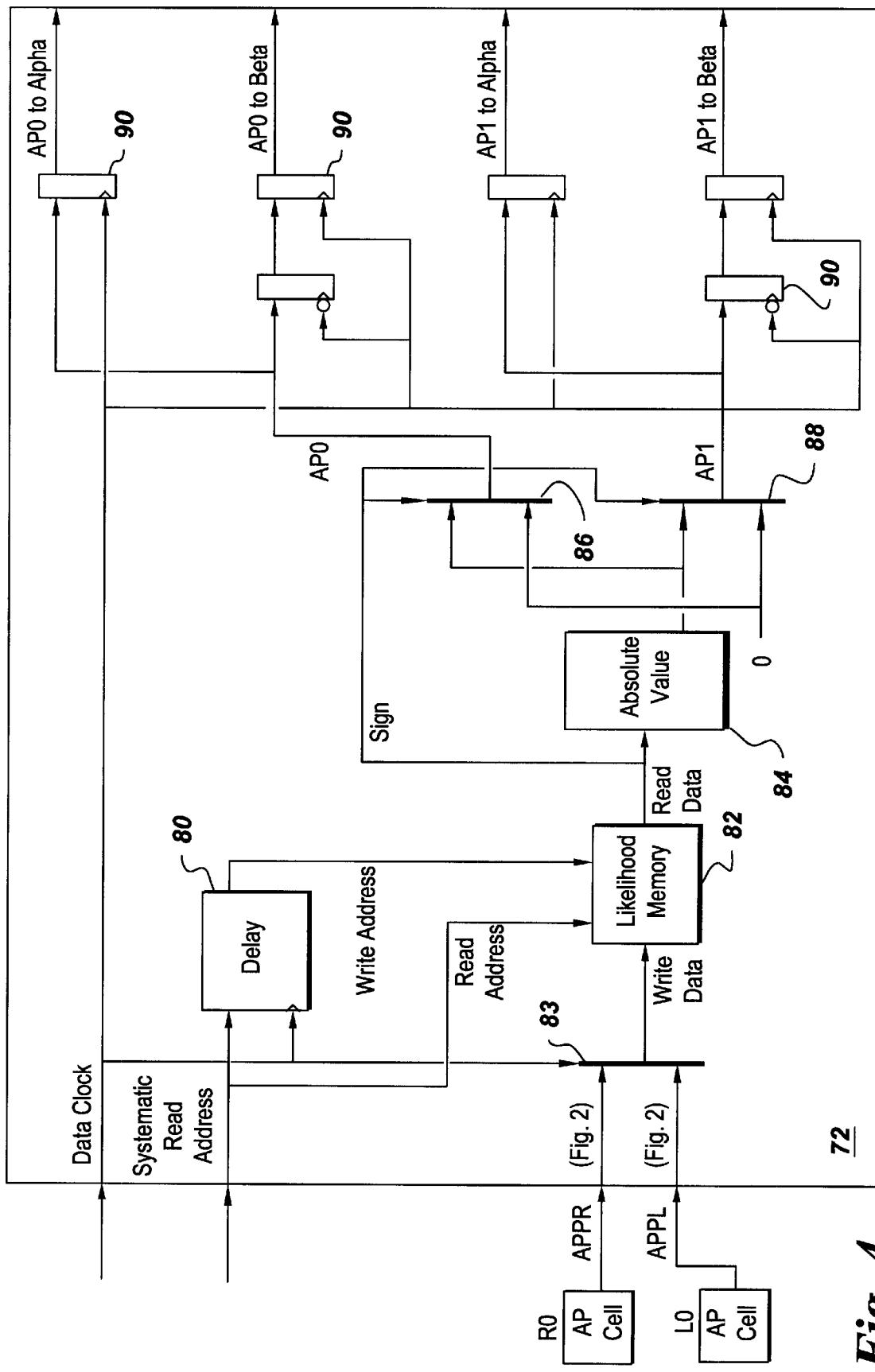
FIG. 4 is a block diagram illustrating a preferred embodiment of a likelihood ratio circuit of the turbo decoder of FIG. 3.
Figure 5:
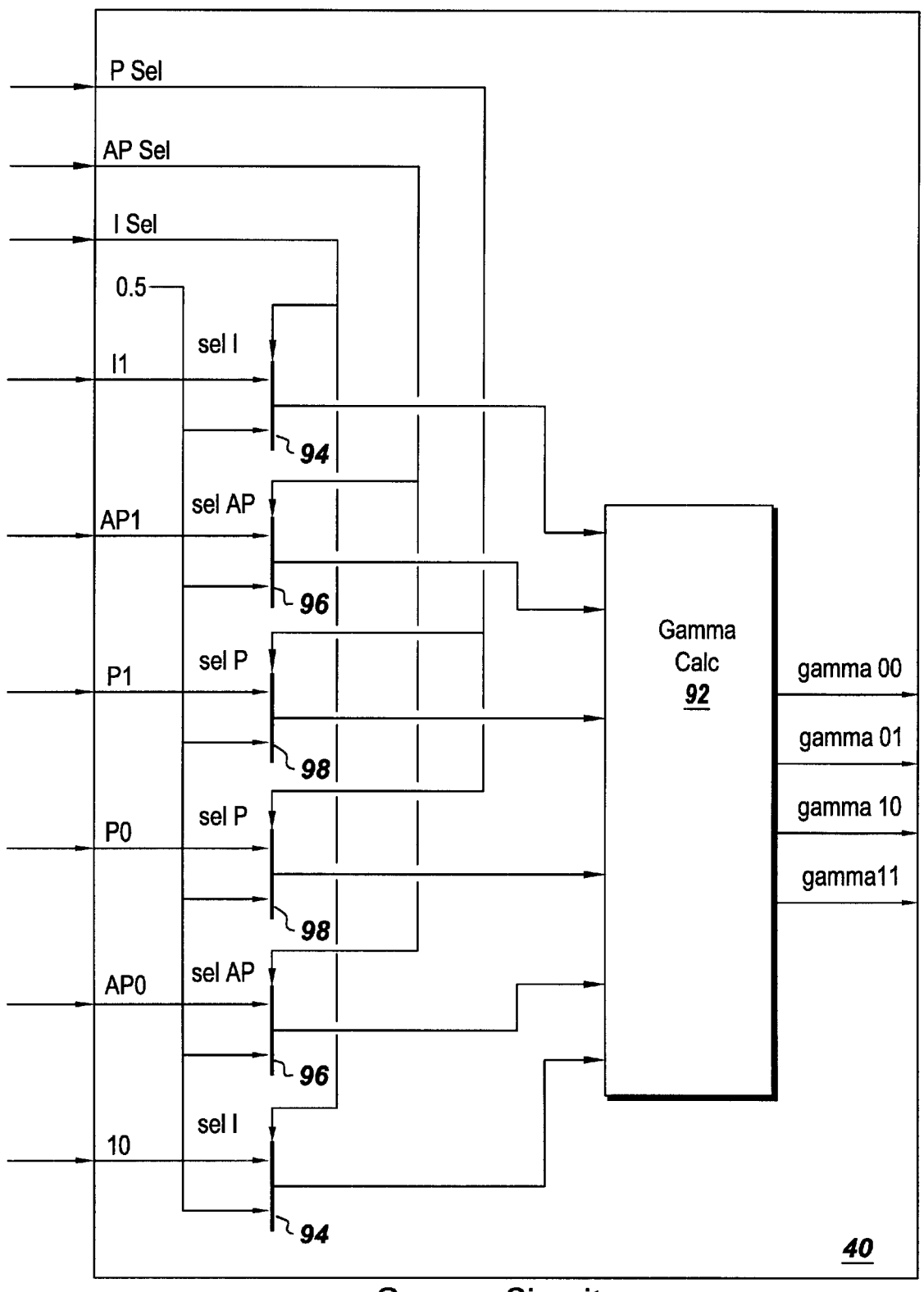
FIG. 5 is a block diagram illustrating a preferred embodiment of a gamma calculator of the turbo decoder of FIG. 2.

A preferred implementation of likelihood ratio circuit 72 is illustrated in FIG. 4. The inputs to the likelihood ratio circuit are a data clock signal, the systematic read address from the address generator, and the a posteriori estimates from the sigma calculators 50 which calculates the a posteriori estimates according to equation 12. The systematic read address is applied to a delay block 80 and a likelihood memory 82. The a posteriori estimates from the sigma blocks are selected via multiplexer 83 and provided as write data to likelihood memory 82. The output of memory 82 is applied to an absolute value block 84. In addition, the sign of the read data from memory 82 is applied as a control signal, along with a 0 bit, to multiplexers 86 and 88. The outputs of multiplexers 86 and 88 are applied to registers 90 such that two likelihood ratios are read from memory 82 each alpha/beta recursion update cycle, converted to bit probabilities, and routed to the appropriate gamma calculator 92, as illustrated in FIG. 5. (Each gamma block 40 comprises four gamma calculators 92).

As representative, FIG. 5 shows the inputs to one of the four gamma calculators 92 via selection switches, or multiplexers, 94, 96 and 98. The inputs are the a priori bit probabilities, AP0 and AP1, and the systematic and parity channel transition probabilities, represented as I0, I1, P0 and P1. The channel transition probabilities P0 and P1, or $R(X_t|Y_t)$, are computed as the one-dimensional channel probabilities for the information and parity bits:

$$R(Y_{t_i}|X_{t_i}), R(Y_{t_p}|X_{t_p}) \quad 13$$

where $X_{t_i}$ and $X_{t_p}$ are the systematic and parity components of the transitions respectively. The transition probability $p_t(m|m')$ is zero for invalid transitions and is otherwise equal to the a priori bit probability of the systematic bit $X_{t_i}$.

$$\gamma_t(m', m) = 0 \quad \text{when } p_t(m|m') = 0 \quad 14$$
$$= AP_t(0) \cdot R(Y_{t_i}|0) \cdot R(Y_{t_p}|X_{t_p}) \quad \text{when } (X_{t_i}|m', m) = 0$$
$$= AP_t(1) \cdot R(Y_{t_i}|1) \cdot R(Y_{t_p}|X_{t_p}) \quad \text{when } (X_{t_i}|m', m) = 1$$

where $AP_t(k)$ is the a priori probability for the systematic bit at trellis level t. Furthermore, the only values that the parity symbol can assume are 0 and 1 so that at any trellis level, there can be only four possible non-zero values for gamma.

$$\gamma_{t,00}(m',m) = AP_t(0) \cdot R(Y_{t_i}|0) \cdot R(Y_{t_p}|0)$$
$$\gamma_{t,01}(m',m) = AP_t(0) \cdot R(Y_{t_i}|0) \cdot R(Y_{t_p}|1)$$
$$\gamma_{t,10}(m',m) = AP_t(1) \cdot R(Y_{t_i}|1) \cdot R(Y_{t_p}|0)$$
$$\gamma_{t,11}(m',m) = AP_t(1) \cdot R(Y_{t_i}|1) \cdot R(Y_{t_p}|1) \quad 15$$

Each gamma calculation requires two multiplication functions and depends only on the a priori bit probability and the received symbol for the trellis level. Each set of gamma functions for a trellis index t requires the a priori bit probability for 0 and 1 and four channel probability computations.

Advantageously, by using multiplexers 94, 96, 98 in the gamma calculator, as shown, multiple code rates may be supported. Multiple code rates are constructed by puncturing the parity data of the top and bottom component codes. Specifically, multiplexers 98 (P Sel) are switched according to the puncturing pattern; and multiplexers 94 (I Sel) and multiplexers 96 (AP Sel) are used to control feedback in the turbo decoding algorithm. Puncturing involves selectively neutralizing the parity bit contribution of the gamma calculation of equation 15. Neutralizing of the parity portion of the gamma calculation is performed in the gamma calculator using a multiplexers 98.

In an exemplary embodiment, when the controller signifies that a parity bit is punctured, the gamma calculator eliminates the third term in the calculation of the set of gamma values for that symbol. If the puncturing rate of the parity bits is greater than ½, and, at minimum, every other symbol is punctured, then every two memory locations in the parity memory will contain only one valid symbol.

Referring back to FIGS. 2 and 5, let $t_R$ be defined as the trellis level index for the alpha recursion and $t_L$ be defined as the trellis level index for the beta recursion. With a block length of τ, the alpha recursion begins at trellis level $t_R=0$ and ends at trellis level $t_R=\tau-1$. The beta recursion beings at $t_L=\tau$ and ends at trellis level $t_L=1$. Since according to preferred embodiments of the present invention, the alpha and beta recursions are operated in parallel, with indices $t_R$ and $t_L$ having different values and counting in opposite directions, eight gamma values must be calculated simultaneously, i.e., four values for the alpha recursions in parallel with four values for the beta recursions. Hence, two sets of a priori bit probabilities and eight table look-up values are needed for each update cycle.

The four gamma values for index $t_R$ are routed to the alpha block, and the four gamma values for index $t_L$ are routed to the beta block. In a recursive systematic code (n, k) for which k=1, i.e., one bit shifted into the encoder, the alpha and beta recursions each have only two terms in their summations. The two non-zero terms for each state of the trellis are known under certain code restrictions and can be hard-wired. Within the alpha and beta blocks, the matching of the feedback portion of the recursion with the correct value is performed using multiplexers. The multiplexers are controlled by switches which identify the correct gamma matching for state m and systematic bit k, where TS(m, k) identifies the trellis connection for state m and systematic bit k.

Since the alpha and beta recursions begin at opposite ends of the code-word, there is not enough information available to compute the sigma values until each recursion is half finished. At such time, all of the sigma values which reside at trellis indexes following both the alpha and beta blocks can be calculated. For a sixteen-state recursive systematic code there will be sixty-four such values. Fortunately, these can be naturally grouped into four categories using equation 12. In a recursive systematic code with sixteen states, there are sixteen elements in the summation. In one cycle of the alpha and beta recursions, equation 12 can be invoked four times. The four summations simultaneously compute $APP_{t_R}(0)$, $APP_{t_R}(1)$, $APP_{t_L}(0)$ and $APP_{t_L}(1)$.

Until the point where the sigma-AP blocks can compute a posteriori transition probabilities, the alpha and beta probabilities are buffered, which requires considerable memory. There must be enough memory to buffer half of the alpha and beta functions for the block. For a sixteen-state code, and a block length of five hundred twelve information bits, the memory requirement is 16·2·512/2=8192 words. Longer blocks require additional memory, as do terminating tails on the component codes. This memory is implemented as thirty-two separate memories, one for each state of the alpha and beta recursions. Advantageously, in accordance with preferred embodiments of the present invention, the control for the memories comprises a low-complexity design. The memories can be written to consecutive locations starting at the first location. When the iteration is half completed, the memories can be read, starting from the last location written and decrementing until the iteration is completed. Both the alpha and beta memories share the same control.

Routing of the alpha and beta values to the sigma-AP block is controlled by multiplexers in the alpha and beta blocks, which select the feedback path in the recursion. These multiplexers match the alpha and beta values generated in real-time in the alpha and beta blocks, respectively, with the beta and alpha values respectively buffered in memory.

The sigma calculations also require the gamma values. For this operation, there are two gamma calculator blocks which calculate and supply the sigma-AP block with the four possible gamma values for the trellis indices $t_R$ and $t_L$. Separate gamma-calc-cells are used to allow selective neutralizing of the systematic contribution of the gamma value and/or the a priori portion of the gamma value. Matching of the appropriate alpha, beta, and gamma values in equation 8 is performed with the selection switches described hereinabove. The gamma-calc-cells which have outputs provided to the sigma-AP blocks require the same input bit probabilities and channel probabilities as the gamma-calc-cells which support the alpha and beta recursions.

The outputs of the sigma-AP blocks are updated systematic bit probabilities. These probabilities are converted into likelihood ratios and written to the likelihood ratio memory for use with the subsequent iteration. The memory locations that these likelihood ratios must be written to can be derived from the read address of the likelihood ratio memory. The write address is simply a delayed copy of the read address. The delay required is the propagation delay of the information through the circuit. Typically, this delay will be about five cycles of the alpha/beta recursion period. All circuits, except the alpha/beta update circuit, can operate with multiple cycles without any significant decoding speed loss.

The computation of the channel probability function $R(\cdot|\cdot)$ is performed using a look-up table. In an exemplary implementation, the input data sequence $Y_t^\tau$ is quantized into 64 levels, and a lookup table containing the 128 different values 64 levels (bit values 0 and 1) of the function $R(\cdot|\cdot)$ is pre-computed. When a specific value of the channel probability function is required, the pre-computed value can be read from the table and provided to the gamma block. The memory required to store the 128 table elements is small, and the performance loss due to 64 level (6 bit) quantization of the inputs is minimal.

Typically, a MAP decoder requires data in an order consistent with that of the output of the encoder. In accordance with preferred embodiments described herein, however, the MAP decoder may compute the alpha, beta, and sigma functions in parallel and thus require data in a different order, that is, forward and backward with respect to the trellis structure.

In order to use a single address generator 30 for the systematic data samples, the likelihood ratio samples, and the parity data samples, a separate memory is utilized for each, as illustrated in FIG. 3. In addition, the data is mapped into each memory location using the same convention. For example, the $p^{th}$ memory location of each of the systematic data memory, the likelihood ratio memory, and the top parity data memory would contain the systematic data sample, the likelihood ratio estimate, and the parity data sample, respectively, for a given trellis level. Advantageously, with this memory mapping, a single address generator can be used to generate inputs for the top MAP decoder. And assuming that the MAP decoder generates a posteriori likelihood ratio estimates in the same order as the data is provided to the MAP decoder, then the same address can also be used as a write address for the likelihood ratio estimates.

The bottom code is supported with a similar data path structure, including an additional memory comprising the de-interleaver mapping, or definition (block 60 of FIG. 3). In decoding of the bottom code, the address generator provides input to the de-interleaver memory. The output of the de-interleaver memory is then used as the address for the systematic data memory and the likelihood ratio memory. The de-interleaver memory is arranged such that the order of the systematic data and other inputs to the MAP decoder are in the correct order. The bottom code parity data is stored in memory such that re-ordering of addresses is not required. Multiplexers are used to select the addresses for the systematic data memory and likelihood ratio memory and to select data from the parity data memories. A control signal from the top/bottom select block 66 to the multiplexers indicates whether the top or bottom code is being decoded.

The use of memory, as described hereinabove, allows real-time interleaving and de-interleaving. And since the memory can be pre-loaded, an arbitrary interleaver and a variable size block length for the turbo code are easily supportable. In order to change the interleaver structure, a new interleaver definition is merely downloaded. And for a block-length change, a new de-interleaver definition and a change in the address generator's sequence are needed.

In order to support a MAP decoder which computes the alpha and beta recursions simultaneously, the address generator needs to be able to access the systematic data and likelihood ratios for the alpha and beta recursions simultaneously. A sequential counter may be used for this purpose. In particular, the data corresponding to trellis level τ is placed in address number 0 for the beta recursion, and the data corresponding to trellis level 1 is place in address number 1 for the alpha recursion. The data is alternately stored in this manner such that the data can be addressed with an address generator with the sequence [0 1 2 3 . . . ]. Since the data corresponding to trellis level 1 is the last value required by the beta recursion, and the data corresponding to trellis level τ is the last value required in the alpha recursion, the address generator would comprise the following sequence [0 1 2 3 4 5 . . . τ–1 τ–1 τ–2 . . . 3 2 1 0]. In such case, the data for the alpha recursion comprise the even locations in the sequence, for example, and the data for the beta recursion comprise the odd locations in the sequence. A similar type of memory mapping would result in alpha recursion data in the odd locations and beta recursion data in the even locations. This memory mapping is used for the systematic data memory, the parity data memory, and the likelihood ratio memory. In the particular sequence represented hereinabove, this address generator supports a variable size block length by changing the maximum address τ–1.

Further efficiency improvement in memory mapping can be achieved where the puncture rate is at least ½, i.e., every other symbol, by dividing the sequence [1 2 3 4 5 . . . τττ–1 τ–2 . . . 3 2 1] by two, addressing the parity data with the new sequence, and controlling the gamma calculator with a punctured signal.

The bottom code requires different parity values, but requires the same likelihood values and systematic data values as the top code. The difference is that the bottom code requires the likelihood values and systematic data values in a different order, as a result of interleaving.

Parity data is treated differently from systematic data and likelihood ratios. Since the parity data for the bottom code is independent from the top code parity data, separate memories could be provided for the parity data. However, for practical reasons, they may be implemented using the same physical memory with the top and bottom codes occupying different portions of the same memory.

Physical separation of memories would not generally be practical for the systematic data since double the memory space would be required. And physical separation is not possible for the likelihood ratio memory because the same likelihood ratio is required for both the top code and the bottom code and because they are each updated during each half-iteration of the turbo decoder. A solution is to use a separate memory for storing the interleaver definition. When the decoder is decoding the bottom code, it reads the interleaver with the address sequence [0 1 2 3 4 5 . . . τ–1 τ–1 τ–2 . . . 3 2 1 0]. The output of the interleaver is then used for the systematic data address and the likelihood ratio address. Since the interleaver comprises a one-to-one mapping, such a structure would support an arbitrary interleaver structure.

Figure 6:
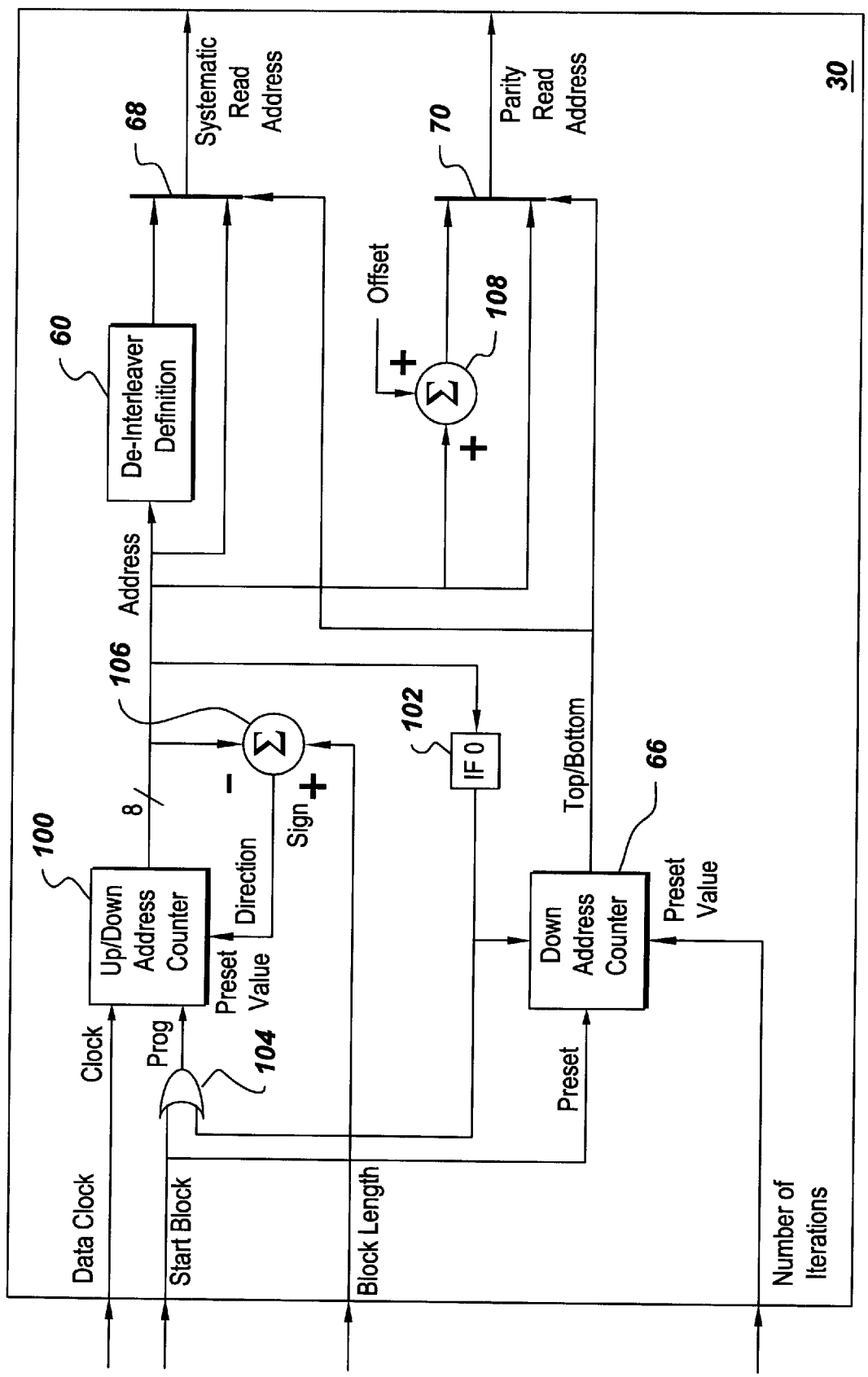
FIG. 6 is a block diagram illustrating a preferred embodiment of an address generator of the turbo decoder of FIG. 3.

FIG. 6 illustrates address generator 30 in more detail. The address generator accesses data and likelihood ratios for the alpha and beta recursions, and supports the top and bottom codes of the turbo code. As shown, the inputs to the address generator are an initialization signal (start block), a data clock signal, a signal indicative of block length, and a signal indicative of the number of iterations in the MAP decoding algorithm. The start block signal is applied along with the output of an up/down address counter 100, via a count zero indicator block 102, to an OR gate 104, the output of which is applied to the up/down counter along with the data clock signal. The block length signal is applied as an input to the up/down counter and to a comparator 106 wherein it is compared with the output of the up/down counter to provide a sign, or direction, signal to the up/down counter. The address from the up/down counter is applied to the de-interleaver definition block 60 (FIG. 3), the output of which is applied to multiplexer 68 (FIG. 3), which selects the systematic read address. The address from the up/down counter is also applied along with a predetermined offset value to a summer 108 to multiplexer 70 (FIG. 3), which selects the parity data address. Multiplexers 68 and 70 are controlled by the top/down code select control block 66 which is labeled in FIG. 6 as a down iteration counter based on the particular implementation illustrated in FIG. 6. (See also FIG. 3.) The inputs to the down iteration counter (or the top/down code select control block) 66 are the start block initiation signal which presets the counter and the signal representative of the number of iterations. As illustrated, the outputs of the address generator are the systematic and parity read addresses. These addresses are provided as inputs to the channel probability generator circuit 120 (FIG. 7) and the likelihood ratio circuit 72 (FIG. 4).

Figure 7:
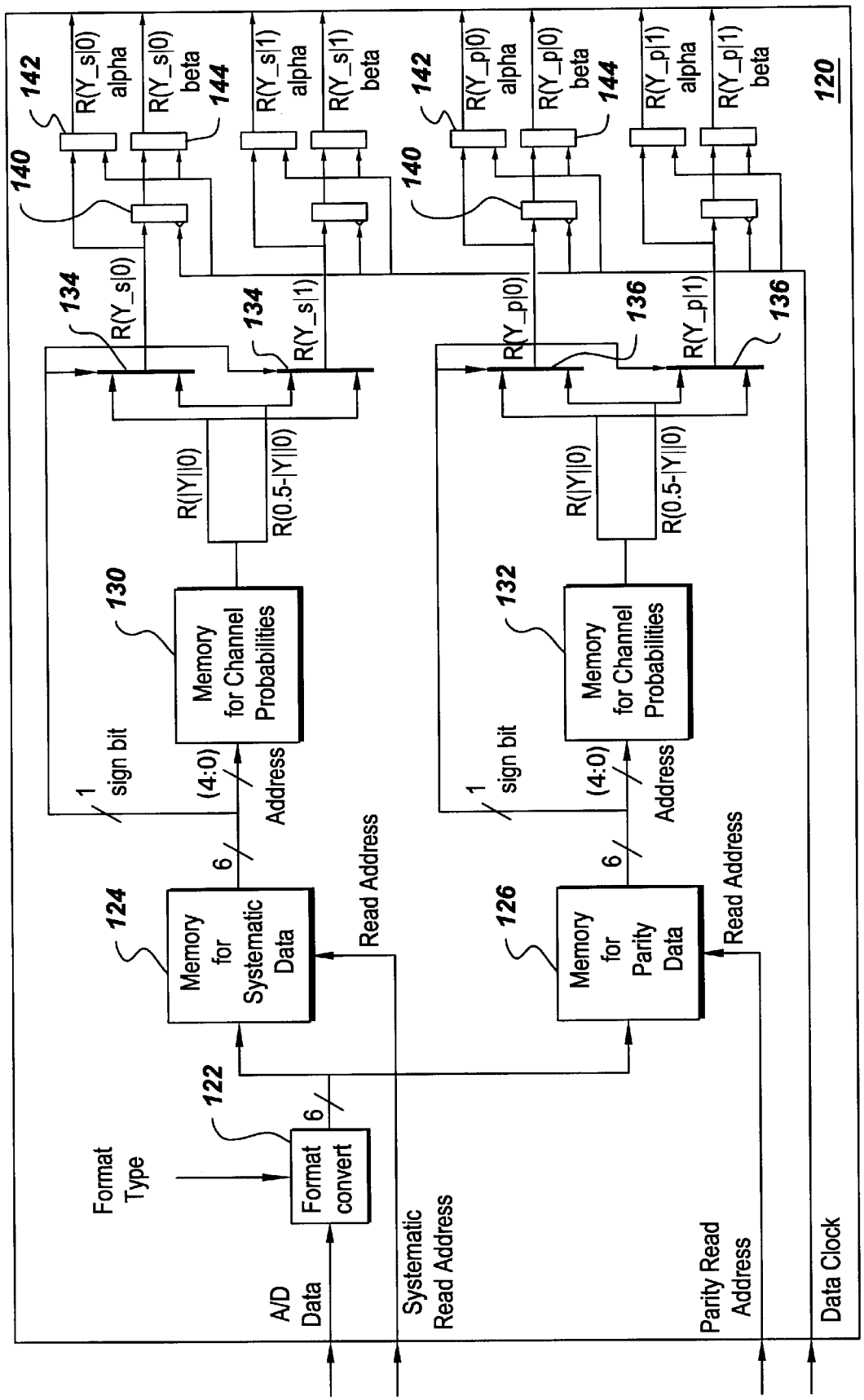
FIG. 7 is a block diagram illustrating a preferred embodiment of a channel probability generator of the turbo decoder of FIG. 3.

As illustrated in FIG. 7, the channel probability generator circuit 120 generates the channel probabilities required by the gamma calculator circuit (FIG. 5) for generating the alpha and beta recursions simultaneously. And, as described hereinabove, by using multiplexers in the gamma calculator, as illustrated in FIG. 5, multiple code rates may be supported.

Computation of the systematic and parity contributions to the gamma function in parallel requires two identical channel transition probability tables. Each time that channel probability $R(y|0)$ is accessed for received symbol y, a corresponding value is required for $R(y|1)$. Hence, for each single look-up table access, the values for both $R(y|0)$ and $R(y|1)$ may be provided. Advantageously, therefore, by using parallel circuits for the systematic and parity components and by returning two channel probabilities per table access, the eight required channel probabilities can be accessed at the same rate as the likelihood memory.

Specifically, as illustrated in FIG. 7, a preferred embodiment of the channel transition probability generator receives as inputs the systematic and parity read addresses from the address generator (FIG. 6). The received data is provided to a format convert block 122, which also receives a signal indicative of format type and converts it to 6-bit data, for example, with the first bit comprising a sign bit. The data is provided to a memory for systematic data 124 and is stored at locations specified by the write address along with the systematic write address, and to a memory for parity data 126, along with the parity write address. The output of each memory block 124 and 126, respectively, is provided to a memory for channel probabilities, 130 and 132, respectively. Each memory comprises a look-up table for channel transition probabilities, each single table address being loaded with the probabilities $P(1|X)$ and $P(0|X)$, or P0 and P1, as referenced hereinabove with respect to FIG. 5. The sign bit output from each data memory comprises the control signal for multiplexers 134 and 136, respectively, for selecting the appropriate value of the channel transition probability from the look-up tables. Through the system of registers 140, 142 and 144, illustrated in FIG. 7 for parallel processing, two channel probabilities are returned per table access, and the eight required channel probabilities are accessed at the same rate as the likelihood memory.

An alternative embodiment allows for terminated recursive systematic convolutional (RSC) codes for the top and bottom code, and for a merging of the component codes after 512 trellis levels. The merging of the component codes at trellis level 512 permits decoding of a longer block length by computing the alpha and beta recursions for the two sections separately (in time), but requires only the memory in the alpha and beta cells to decode a block of length 512 information bits. Both the termination of the component codes and the merging of the component codes at trellis level 512 (if the block length is larger than 512) are handled the same way. For this embodiment, separate memory locations are used for the systematic portions of the code-word. To this end, the systematic components of the top code are placed in memory such that the sequence [0 1 2 3 4 . . . τ−1 τ−1 τ−2 τ−3 . . . 3 2 1 0] will access the correct data for that code, and the merging sections of the bottom code are placed in memory cells separate from those of the top code. These memory locations are accessed by loading the interleaver with the appropriate addresses. Advantageously, since the bottom code accesses the data through the interleaver anyway, no additional circuitry is required. The number of trellis levels required to merge the trellis is equal to the memory of the code m, an exemplary value being four.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A control for a turbo decoder for decoding turbo codes comprising two recursive systematic code words concatenated in parallel, each code word comprising systematic data and parity data, the turbo decoder comprising a MAP decoding algorithm, the turbo decoder comprising a gamma block for calculating unconditioned symbol transition probabilities, each unconditioned symbol transition probability representing a gamma value, the gamma block receiving as inputs channel transition probabilities and a priori bit probabilities, alpha and beta blocks for receiving the gamma values from the gamma block and for recursively calculating forward and backward state probabilities, respectively, the forward state probabilities representing alpha values and the backward state probabilities representing beta values, a sigma block for receiving the alpha and beta values, respectively, from the alpha and beta blocks, respectively, and for calculating a posteriori transition probabilities therefrom, the a posteriori transition probabilities representing sigma values, the sigma block performing a summation function of the sigma values to provide a posteriori probability estimates of the systematic symbols of the component code words as outputs of the turbo decoder, the turbo decoder control comprising:

an address generator for addressing the systematic data, the parity data, and systematic likelihood ratios according to a pre-determined memory mapping such that the systematic data samples are accessed in the order required by the MAP decoding algorithm such that interleaving and de-interleaving functions in the MAP decoding algorithm are performed in real-time;

a de-interleaver definition block for receiving the address from the address generator and providing a de-interleaver definition address;

a multiplexer, which is controlled by a top/bottom code select block, for selecting the address from the address generator or the address from the de-interleaver definition block and for providing the selected address directly and through a delay to a systematic likelihood ratio circuit and directly to a systematic data block, the systematic likelihood ratio circuit providing the systematic likelihood ratios to a component decoder, the systematic data block providing systematic data to the component decoder in parallel with the systematic likelihood ratio circuit, the output of the component decoder comprising the a posteriori probability estimates which are fed back through the systematic likelihood ratio circuit;

bottom and top code parity data blocks for receiving the address from the address generator and for providing the parity data via a multiplexer controlled by the top/bottom code select block to the component decoder.

2. The control of claim 1 wherein the channel transition probabilities, comprising the channel transition probability values P1 and P0, are provided in a look-up table.

3. The control of claim 2 wherein the address generator accesses the channel transition probabilities P0 and P1 with a single address.

4. The control of claim 2 wherein the systematic data and parity data are stored in parallel memory tables for simultaneous access.

5. The control of claim 1 wherein the memory mapping comprises a sequence represented as [0 1 2 3 4 5 . . . τ−1 τ−1 τ−2 . . . 3 2 1 0] for the systematic data, the parity data and the likelihood ratios, where τ is programmable and supports variable block lengths.

6. The control of claim 5 wherein the memory mapping sequence [0 1 2 3 4 5 . . . τ−1 τ−1 τ−2 . . . 3 2 1 0] is applied to the alpha and beta blocks.

7. The control of claim 1 wherein the gamma block comprises a puncturing function to support multiple code rates.

8. A turbo decoder for decoding turbo codes comprising two recursive systematic code words concatenated in parallel, each code word comprising systematic data and parity data, comprising:

a MAP decoding algorithm;

a gamma block for calculating unconditioned symbol transition probabilities, each unconditioned symbol transition probability representing a gamma value, the gamma block receiving as inputs channel transition probabilities and a priori bit probabilities;

alpha and beta blocks for receiving the gamma values from the gamma block and for recursively calculating forward and backward state probabilities, respectively, the forward state probabilities representing alpha values and the backward state probabilities representing beta values;

a sigma block for receiving the alpha and beta values, respectively, from the alpha and beta blocks, respectively, and for calculating a posteriori transition probabilities therefrom, the a posteriori transition probabilities representing sigma values, the sigma block performing a summation function of the sigma values to provide a posteriori probability estimates of the systematic symbols of the component code words as outputs of the turbo decoder;

an address generator for addressing the systematic data, the parity data, and systematic likelihood ratios according to a pre-determined memory mapping such that the systematic data samples are accessed in the order required by the MAP decoding algorithm such that interleaving and de-interleaving functions in the MAP decoding algorithm are performed in real-time;

a de-interleaver definition block for receiving the address from the address generator and providing a de-interleaver definition address;

a multiplexer, which is controlled by a top/bottom code select block, for selecting the address from the address generator or the address from the de-interleaver definition block and for providing the selected address directly and through a delay to a systematic likelihood ratio circuit and directly to a systematic data block, the systematic likelihood ratio circuit providing the systematic likelihood ratios to a component decoder, the systematic data block providing systematic data to the component decoder in parallel with the systematic likelihood ratio circuit, the output of the component decoder comprising the a posteriori probability estimates which are fed back through the systematic likelihood ratio circuit;

bottom and top code parity data blocks for receiving the address from the address generator and for providing the parity data via a multiplexer controlled by the top/bottom code select block to the component decoder.

9. The turbo decoder of claim 8 wherein the channel transition probabilities, comprising the channel transition probability values P1 and P0, are provided in a look-up table.

10. The turbo decoder of claim 9 wherein the address generator accesses the channel transition probabilities P0 and P1 with a single address.

11. The turbo decoder of claim 9 wherein the systematic data and parity data are stored in parallel memory tables for simultaneous access.

12. The turbo decoder of claim 8 wherein the memory mapping comprises a sequence represented as [0 1 2 3 4 5 ... $\tau-1\ \tau-1\ \tau-2$ ... 3 2 1 0] for the systematic data, the parity data and the likelihood ratios, where $\tau$ is programmable and supports variable block lengths.

13. The turbo decoder of claim 12 wherein the memory mapping sequence [0 1 2 3 4 5 ... $\tau-1\ \tau-1\ \tau-2$ ... 3 2 1 0] is applied to the alpha and beta blocks.

14. The turbo decoder of claim 8 wherein the gamma block comprises a puncturing function to support multiple code rates.

* * * * *